United States Patent [19]

Warner

[11] 4,231,023
[45] Oct. 28, 1980

[54] BINARY TO TERNARY CONVERTER

[75] Inventor: Richard C. Warner, Morris Plains, N.J.

[73] Assignee: The Singer Company, Little Falls, N.J.

[21] Appl. No.: 19,991

[22] Filed: Mar. 12, 1979

[51] Int. Cl.² .......................................... H03K 13/24
[52] U.S. Cl. ............................................ 340/347 DD
[58] Field of Search ............ 340/347 DD; 325/38 A; 178/66, 67, 68; 375/17, 19, 20

[56] References Cited

U.S. PATENT DOCUMENTS

| 3,611,141 | 10/1971 | Waters | 325/38 A |
| 3,866,147 | 2/1975 | DeCoureur | 325/38 A |
| 4,092,595 | 5/1978 | Weir | 340/347 DD |
| 4,097,859 | 6/1978 | Looschen | 325/38 A |

Primary Examiner—Charles D. Miller
Attorney, Agent, or Firm—John C. Altmiller; T. W. Kennedy

[57] ABSTRACT

A circuit for converting serial binary coded ternary information received on one line into ternary signals for transmission on two lines. The presence or absence of a pulse in a first interval is compared with the presence or absence of a pulse in the succeeding interval and a voltage representing one ternary condition is transmitted on one line if pulses are present, on another line, if pulses are absent, and no signal is transmitted if alternating pulses are received.

3 Claims, 2 Drawing Figures

BINARY TO TERNARY CONVERTER

BACKGROUND OF THE INVENTION

This invention relates in general to electric signal processing circuits and, more particularly, to new and improved means for converting ternary data being transmitted in serial binary code on one transmission line into ternary data for transmission on two such lines.

Technological advance in the field of signal processing, as exemplified by the development of pulse code modulation, has evolved along several lines. In general, most systems utilize binary modulation in which the absence or presence of a signal is used to provide the smallest bit of information. Such a signal is ordinarily carried on one transmission line, such as a pair of wires.

There are instances, however, where a ternary signal is conveniently used and the data is carried on two such lines. In such a system, each line carries binary coded data and the presence of a signal on a given line indicates a corresponding state; thus, a signal on one line would indicate a positive state, a signal on the other line, a negative state, and no signal on either line, a zero state. An example of this occurs in control systems where three signal levels are used to indicate a particular state or condition, such as: forward, reverse, or neutral; or up, down, or center. Some inertial guidance systems use ternary signals of this kind for communicating error signals between a stable platform and a computer. In other inertial guidance systems, binary signals are used. With proliferation of such guidance systems, it is becoming more and more desirable to interchange components within the systems, substituting a stable platform using ternary signals for one using binary signals, and vice versa. There has been a need, for example, for circuitry capable of linking the binary output of one stable platform with the ternary input of a computer with which it was not originally designed to operate. Such a circuit would also have utility in systems where two units, ordinarily communicating by a two line circuit, are widely spaced apart and system economics and reliability requirements indicate a need for a single communication line to perform the same function betwen the units.

SUMMARY OF THE INVENTION

This invention realizes these objects and others which will become apparent to those skilled in the art. In it, serial binary coded information is converted into serial ternary coded information under the control of a clock which is synchronous with the input. Thus, the current, or "present" value of the input signal is remembered during a clock interval. At the end of that time, the current value of the input is read, and, if it is the same as the remembered value, a predetermined ternary signal is transmitted on the output binary lines. Thus, if succeeding input signals are positive, one output line would also be positive. If, on the other hand, successive zero voltage levels are read, then the other output line would be made positive. Finally, if the input alternates on and off at the clock pulse interval, then neither output line is made positive, and the third ternary condition is represented by the transmision of no signal on either line.

In one embodiment, a circuit employs three flip-flops, one for remembering the last state of the input and one each to control the state of the ternary output lines; the flip-flops are interconnected by means of an AND and a NOR gate, performing Boolean logic functions, to produce the above result.

DETAILED DESCRIPTION OF THE INVENTION

Figure 1:
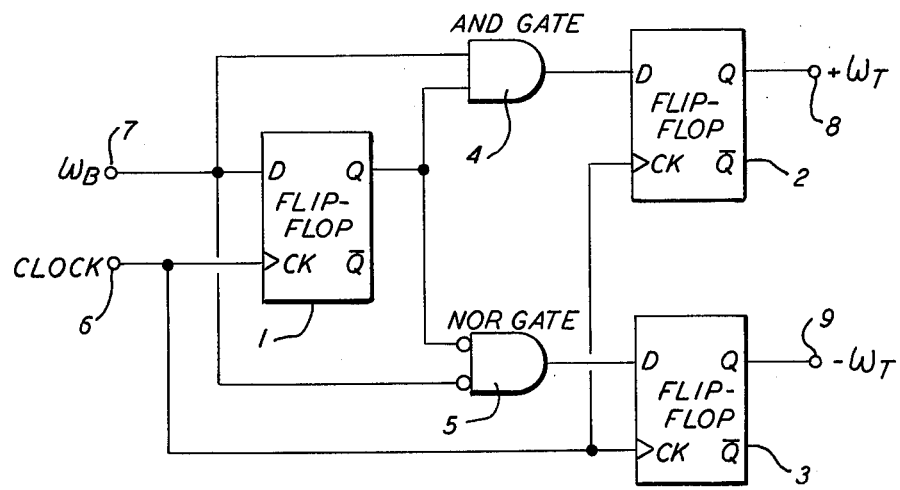
FIG. 1 is a schematic representation of a circuit for converting ternary data transmitted as serial coded binary data on one line into ternary data in binary form for transmission on two lines in accordance with the teachings of the invention.
Figure 2:
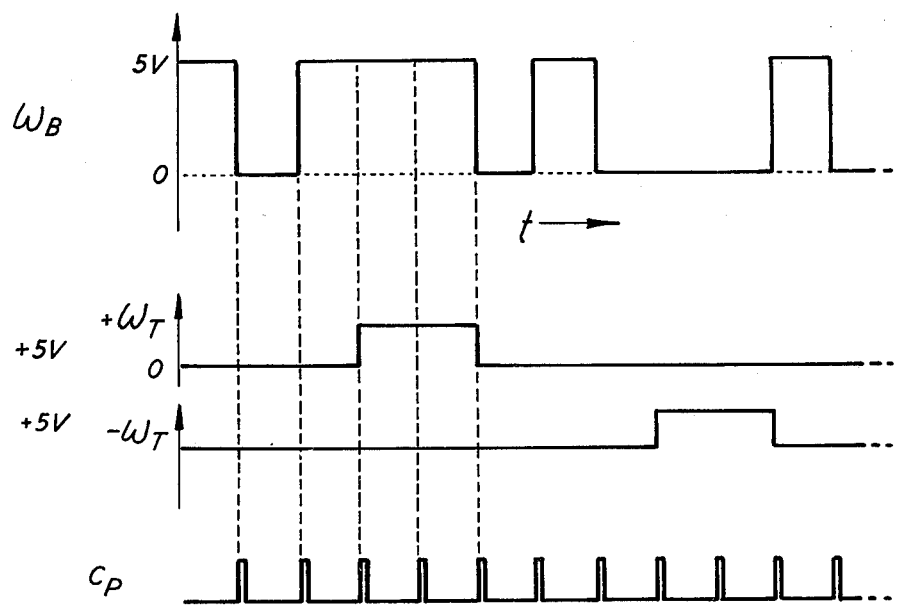
FIG. 2 is a representation of the input and output waveforms of the circuit of FIG. 1.

The illustrative embodiment of FIG. 1 is a circuit for converting ternary data $\omega_B$ received in binary form on a single transmission line to ternary outputs $+\omega_T$ and $-\omega_T$ on two data lines. The input signal $\omega_B$ consists of: a train of 50% duty cycle square waves which represents one ternary condition; an elongated positive going pulse, representing a second ternary condition; or an elongated zero pulse whicgh indicates the third ternary condition. The desired output signals will comprise: no output on either the $+\omega_T$ or $-\omega_T$ line in the case of the 50% duty cycle square wave input; a plus signal on the $+\omega_T$ line in the case of an elongated positive pulse on the input; and a plus signal on the $-\omega_T$ output line in the case of the elongated zero pulse input. The relationship between these signals is shown graphically in FIG. 2. It will be understood that the output signals are arbitrarily chosen and that other signal pairings may be used.

The circuit employs three D-type flip-flops which may be portions of the component generically known as a hex D-flip-flop type 54174. It also uses a 2-input AND gate, which may be a portion of the component known as a quad 2-input AND gate, generic type 5408, and a 2-input NOR gate which may be a portion of the component known as a quad 2-input NOR gate, generic type 5402. Flip-flow 1 receives the binary input signal from input connection 7 at terminal D and receives the clock pulse input from connection 6 at its CK terminal. (Return circuits or grounds are not shown.) The output of flip-flop 1 is fed from terminal Q to one input of AND gate 4 and to one input or NOR gate 5. The input signal $\omega_B$ is connected to the other input of AND gate 4 and to the other input of NOR gate 5. The outputs of AND gate 4 and NOR gate 5 are connected to the D input terminals of $+\omega_T$ control flip-flop 2 and $-\omega_T$ control flip-flop 3, respectively. These flip-flops are also supplied at their clock input terminals CK with signals from clock input 6. The ternary outputs are derived from the Q output terminals of flip-flops 2 and 3, being arbitrarily designated $+\omega_T$ and $-\omega_T$, respectively.

The input, binary data stream $\omega_B$, is synchronous with the clock pulse input. All changes in state of the outputs, the internal flip-flops, and the input occur in response to the rising edge of the clock pulse supplied at terminal 6. Thus, when the clock pulse rises, the current value of the data input $\omega_B$ at input 7 is clocked into the first flip-flop 1. Flip-flop 1 retains this value, acting as a memory of the past state of $\omega_B$, the system input, during the ensuing clock period. AND gate 4 prepares the input to $+\omega_T$ flip-flop 2 and determines whether the system data input has remained positive for two successive clock periods. Thus, if $\omega_B$ remains positive for two successive clock periods, the gate performs the Boolean logic function equation:

$(\omega_B)$ (Flip-Flop 1)=Logic "1".

When this function is satisfied, the rising edge of the clock pulse applied to flip-flop 2 sets flip-flop 2 to the logic 1 state, this action having been enabled by the positive output of AND gate 4. The output of flip-flop 2 is therefore a positive state transmitted to the output connection 8.

If binary stream $\omega_B$ has not been of the same positive value for two successive clock periods, the Boolean logic function equation above is not satisfied, and the second flip-flop 2 and the $+\omega_T$ ternary output are set at logic "0", matching the output of the AND gate.

Similarly, NOR gate 5 performs the Booleans logic function:

$(\overline{\omega_B})$ $(\overline{\text{Flip-Flop 3}})$=Logic "1".

Thus, if the binary input data stream $\omega_B$ has been in the logic "0" state for two successive clock periods, the output of flip-flop 1 will be a logic "0", the output of NOR gate 5 will be a logic "1" and flip-flop 3 will be set to a logic "1" state on the next rising edge of the clock and will supply the logic "1" voltage to output terminal 9. When the second Boolean equation is not satisfied, that is, when the input binary signal $\omega_B$ is alternating at the 50% duty cycle rate, the output of NOR gate 5 is a logic "0" and the next clock pulse sets flip-flop 3 to a logic "0" state and the logic "0" is supplied to output terminal 9.

It will be noted that when the input signal is a square wave, neither flip-flop 2 nor flip-flop 4 is activated, and no signal is transmitted on either the $+\omega_T$ or the $-\omega_T$ output lines, thus constituting the third ternary signal.

It will be understood by those skilled in the art that a particular set of output conditions was employed in the illustrative embodiment above to represent predetermined corresponding input conditions. This choice was arbitrary and others could have been made. Thus, instead of representing the zero rating input condition as $+\omega_T=0$ and $-\omega_T=0$ in the ternary outputs, the outputs $+\omega_T=1$ and $-\omega_T=1$ could as easily have been chosen; the signals for this are available at the not Q ($\overline{Q}$) terminals of the output flip-flops 2 and 3 and merely require suitable output connections. Other combinations of the outputs Q and $\overline{Q}$ may be made, so that the user has a choice of correspondences between input and output signals.

It will be understood by those skilled in the art that, for the sake of simplicity, operating voltages, in this case a nominal 5 volts, have been omitted from the drawing and the description. Thus, in operation, the logic state "1" is represented by a signal having a level of +5 volts and the logic state "0" by a signal having a level of zero voltage or ground. The particular voltages described here are appropriate for the particular components used in the illustrative embodiment, other components and circuit combinations requiring other voltages may be employed within the scope of the teachings of the invention. It is possible, too, that other signal levels than those described may be used for transmitting data. For example, negative voltage levels could be used instead of the positive level described above and, where zero voltage is specified, a voltage level differing from zero may be used so long as it is distinguishable from the first one.

While the invention has been described herein in connection with a specific embodiment for the purposes of illustration, it is to be understood that the teachings of the invention are capable of application in other ways by those skilled in the art without departing from the spirit of the invention as defined in the following claims.

What is claimed is:

1. A circuit for translating ternary data being transmitted in serial binary code on one input line into ternary data coded for binary transmission on two output lines, the input data signalling a first ternary state by means of a signal alternating at an established rate for at least one cycle, a second ternary state by the presence of a signal at a first level for the period of at least one cycle, and a third ternary state by the presence of a signal at a second level for the period of at least one cycle, including
   (a) first means for storing the present state of the input signal during each half cycle and providing said state as an output;
   (b) first logic means having as inputs the output of said means for storing and said input signal and providing an output when both are at said first level;
   (c) second logic means having as inputs the output of said means for storing and said input signal and providing an output when both are at said second level;
   (d) second means for storing the state of the output of said first logic means and providing said state as an output;
   (e) third means for storing the state of the output of said second logic means and providing said state as an output; and
   (f) a clock developing a clock signal occurring each half cycle synchronously with said input signal, each of said first, second and third means for storing responsive to said clock signal to store the state at their respective inputs and provide said states at their outputs, whereby, when said input signal remains at said first level for two half cycles, an output will be provided from said second means, when said input signal is at said second level for two half cycles, said third means for storing will provide an output and when said signal alternates between said first and second levels over a cycle, neither of said second and third means for storing will provide an output.

2. The circuit of claim 1 wherein each of said means for storing comprise a D-type flip-flop.

3. The circuit of claim 2 wherein said first logic means comprise an AND gate and said second logic means a NOR gate.

* * * * *